May 26, 1959 D. C. ATKINS, JR., ET AL 2,888,335

PROCESS OF CHEMICAL ETCHING

Filed April 23, 1956

DON C. ATKINS, JR. &
RICHARD V. EDDS
INVENTORS.

BY Philip Subkow

ATTORNEY.

United States Patent Office 2,888,335

Patented May 26, 1959

2,888,335

PROCESS OF CHEMICAL ETCHING

Don C. Atkins, Jr., Whittier, and Richard V. Edds, Los Angeles, Calif., assignors to Turco Products, Inc., Los Angeles, Calif., a corporation of California Application April 23, 1956, Serial No. 580,087

3 Claims. (Cl. 41—43)

Figure 1:
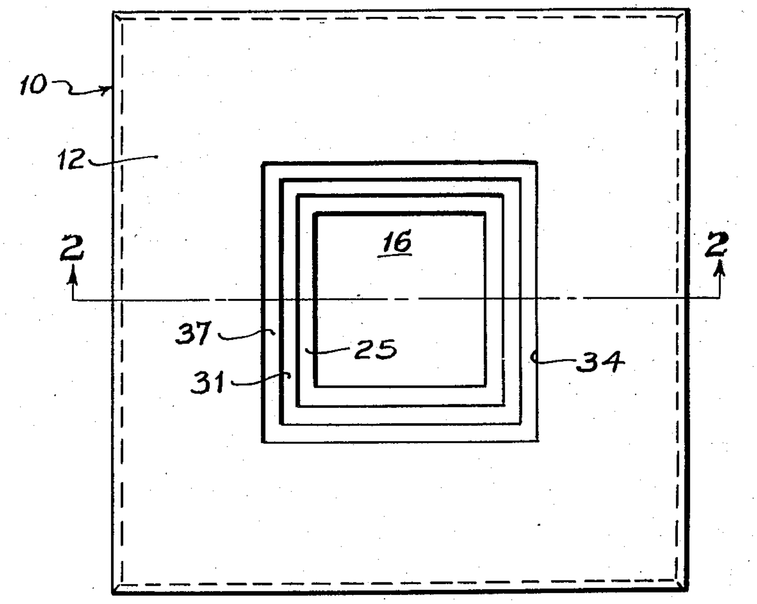

This invention relates to the coating or masking of the surfaces of objects and parts to protect such coatings or surfaces from attack during chemical etching of the exposed uncovered surface portions of such objects. The invention is more particularly concerned with novel procedure to facilitate production of an etch pattern, including a pattern of varying depths of etch, in the surface of an object.

In chemical etching or milling, material or metal is removed from the surface of the part by treatment thereof in an etching solution to obtain a part having a desired structural or ornamental configuration. In many instances, in order to produce a desired etch configuration on an article in a practical manner, it is necessary to mask certain portions of the surface of the article so as to prevent contact of such surface portions by the etching solution.

The most serious disadvantages encountered in the use of prior art maskants or coatings in etching operations are (1) insufficient adhesion of the mask to the part, (2) insufficient resistance of the mask to the etching solution especially at the edges of the mask, permitting undesirable penetration of the solution between the mask and underlying substrate, (3) and particularly the inability of prior art maskants to be readily strippable from the part after etching.

Thus, for example, in forming etch patterns wherein a plurality of etches of different depths are to be produced on the surface of a part, it has heretofore been the practice to apply a mask to a portion of the surface of the part to be etched, etch to a desired degree, remove the entire mask, apply a new mask to the surface so as to expose the previously etched portion and an additional area, etch these exposed areas, remove the entire mask again, then apply a new mask to expose the previously etched portions and an additional surface portion, etch again, and so on. In this manner a stepwise etch pattern can be produced having adjacent areas of increasing greater depth of etch, that portion which was initially uncovered by the mask and first subjected to etching being of greatest depth, the adjacent areas having successively shallower depths.

It is apparent, whether employing coating or tape as masking materials according to this prior art procedure, that considerable time and labor are expended in successively applying and removing the mask, and large amounts of masking materials are required. Further, the prior art masking materials including maskant compositions comprising vinyls, epoxy resins, silicones, polyamides, polyethylenes and the like, often suffer from the disadvantage that they are difficult to remove after completion of the etching operation, rendering the prior art procedure costly and time consuming. Moreover, the known maskant compositions are often difficult to apply to the substrate in that they are often subject to excessive "cob-webbing" or the formation of thin strands of maskant composition between the application equipment and the part even when said composition has proper solids content, making the handling of these materials somewhat of a nuisance.

One object of this invention is to produce an etch pattern of a desired design, for example in the form of step cuts or etches.

Another object is the provision of novel and rapid procedure for masking, etching a part in a chemical etching solution to form an etch pattern and removal of the mask following etching.

A still further object is to provide an efficient process of the foregoing type employing maskant materials which are readily removable from the part surface both prior to and following etching.

A particular object is to provide a process for etching to produce a stepped etch pattern having multiple etch levels without the necessity for re-masking after each of the etching steps.

Other objects and advantages will be apparent from the following description of the invention.

We have found that the etching of a part for producing a particular etch pattern can be greatly facilitated by applying to the part surface to be protected a plastic or resinous coating composition, said composition forming a maskant which is resistant to attack by etching solutions, has substantial adherence to the part surface during the etching treatment, and whose plasticity remains unaffected by the etching solution, the mask or coating being cuttable and strippable at all times. The process comprises coating a surface with such a material to form a chemically resistant bond, cutting said coating to form a chosen design, stripping a portion of the plastic coating at said cut, etching the exposed uncovered surface portions of the part without affecting the adherence, cuttability and strippability of the plastic coating, and stripping the plastic coating from the surface of the part.

We have found that multiple cuts or etch levels can be produced in the surface of a part with ease, rapidity and a substantial saving in maskant material, by applying a maskant composition of the foregoing type to the surface of an object, providing an exposed unmasked surface area as described above, etching to a desired degree, stripping a portion of said mask to expose an additional surface area, subjecting the part to etching again, and continuing this procedure until the desired stepped etch pattern is obtained. In this manner an etch pattern of varying depths of etch can be formed without the necessity for completely demasking the part after each etching stage and remasking prior to the next etching stage. The maskant coating initially applied may be coated over the entire surface area of the part, and a portion of said mask cut and stripped prior to etching as described above, to leave an exposed surface area, or the initial maskant coating can be applied to only a portion of the surface of the article to be etched, leaving bare unexposed surface area of the part available for etching.

To carry out the process of our invention it is necessary to employ a masking material which can be readily applied to the substrate by conventional methods such as for example spraying or dipping, is inert to etching solutions, e.g. of the alkaline or acid type, and has adherence to the substrate at a controllable degree so that the mask will adhere to the substrate under the severe conditions of the etching bath, namely at elevated temperature and/or high chemical activity but which is readily removable by hand stripping both before and after etching.

To meet these requirements, we preferably employ maskant compositions containing as an essential ingredient thereof a chloroprene polymer resin. It has been found that this type of maskant composition is particularly advantageous in that the mask produced therefrom is readily strippable.

We have developed a maskant composition of the above type, said composition being a mixture of chloroprene polymer, fillers, solvents, retardants and accelerators, the individual components of the composition being present preferably in amounts within certain ranges set out below, particularly to enhance the strippability of the mask.

The chief active ingredients of our maskant composition are chloroprene polymer, carbon black and phenolic resin. In certain instances chlorinated natural rubber can be included in our composition, although this is not an essential ingredient. To the invention composition is generally added an antioxidant, and an accelerator to augment and complete the curing of the mask after application of the maskant composition to the surface of a metal part. The accelerator can be added to the above noted maskant composition just prior to applying such composition to the substrate, but preferably the accelerator can be incorporated into the maskant composition substantially prior to use thereof, and the resulting composition permitted to stand for relatively long periods at normal temperature without resulting in any appreciable curing or "setting up" of the maskant composition prior to use.

In one embodiment, a suitable maskant composition is one which includes a chloroprene polymer such as neoprene, chlorinated natural rubber, phenolic resin, carbon black, antioxidant and solvent, in certain preferred proportions set out below, and an accelerator composition including as essential accelerator component an aldehyde-amine condensate, is added to the aforementioned maskant composition prior to application thereof to a substrate. In another embodiment, a suitable maskant composition is formed by mixing a chloroprene polymer such as neoprene, phenolic resin, carbon black, antioxidant, accelerator and solvent, these ingredients being present in certain preferred proportions. A portion of the carbon black of the latter composition may be replaced by chlorinated natural rubber. These compositions are storable prior to use even though the accelerator has been added thereto.

The strippable characteristics of the mask formed from the above compositions are particularly pronounced. Thus it is possible to spray, dip, or brush a coating of our maskant on a substrate, such as aluminum alloys, and then, after curing the mask under conditions which do not require extremes of temperature or time to complete the curing cycle, the mask may be stripped from the substrate by cutting the mask with a sharp knife or similar instrument and pulling the cut mask from the surface by hand. This property is of advantage since it is now possible to coat an entire surface with the new mask, and then remove the mask from the surface in steps in accordance with a predetermined design. The area which is left masked is thus defined by sharp lines which are in exact accordance with the desired design. Furthermore, this new mask possesses sufficient adhesion such that the boundary between the masked and unmasked area is sharp and definitive even after completion of etching. It is not necessary to perform any additional operation to insure the adhesion of the mask at the boundary between the masked and unmasked areas. In accordance with the invention, a design can be cut in the mask, the part etched a desired amount, another design cut in the mask and etching continued. Further, the mask remains plastic at all times and can be stripped after completion of etching without resorting to the use of special demasking agents.

The above maskant composition should preferably contain by weight from about 5 to 25% chloroprene polymer, about 3 to about 25% carbon black, less than 10% but not less than about 1% phenolic resin, desirably in the form of a phenol-aldehyde resin such as phenol-formaldehyde resin. When the amount of chloroprene polymer employed is in the low portion of the above noted range for this material, the amount of phenolic resin used should also be in the low portion of the range, noted for this material, and when the chloroprene polymer used is in the high portion of its above noted range, the phenolic resin is also utilized in an amount in the high portion of its range set out above. Preferably the composition should also contain about .08 to about 0.6% antioxidant and an amount of accelerator composition ranging from about 0.1% to about 3% by weight of the total maskant composition. The composition may also contain from about 1 to about 10% chlorinated natural rubber if desired, although this ingredient is not essential. The organic solvent constituting the remainder of the maskant composition is generally employed in an amount of from about 50% to about 90% by weight of the maskant composition.

In the above composition, it is noted that to the chloroprene polymer which acts as the impermeable material, there is added a phenolic resin in the proper amount to give the adhesion desired. For a particular chloroprene polymer or mixture thereof, the use of too much phenolic resin will normally cause too much adherence so that the material cannot be properly hand stripped, and conversely use of too little phenolic resin will result in too little adhesion to the substrate so that the mask may fail during the etching process by the etchant creeping beneath the mask. We have found that the use of chloroprene polymer and phenolic resin in the above noted range produces proper adhesion.

It will be understood that the amount of phenolic resin actually used in a given case will depend on several factors. These include the type of alloy to which the maskant composition is to be applied, the condition of the surface of such alloy, the type and amount of chloroprene polymer employed in the maskant composition, and also the amounts and relative proportions of the other components of the maskant composition, as well as the specific compounds constituting said other components. We have found that while the use of less than 10% of phenolic resin is necessary to obtain the improved results of the invention, an amount of about 1% to about 5% of phenolic resin, by weight of the maskant composition is preferred, and produces best results in most instances.

A specific feature obtained by the controlled degree of adhesion is the obtaining of the desired adherence of the mask at the interface following removal of a portion of the mask prior to etching, and during the etching operation.

As the chloroprene polymer component, we prefer to employ the materials known as "Neoprene AC" and "Neoprene KNR," both marketed by the Du Pont Company. However, other chloroprene polymers may also be employed. Neoprene AC has the following properties:

| | |
|---|---|
| Specific gravity | 1.23. |
| Appearance | Light cream to light green. |
| Odor | None. |
| Plasticity | Soft grade: can be dissolved without milling. Medium and hard grades: not soluble without premastication. |
| Solubility | Readily soluble in aromatic hydrocarbons, such as toluene; chlorinated compounds such as carbon tetrachloride; and certain ketones such as methyl ethyl ketone. It is insoluble in aliphatic hydrocarbons, water, alcohol and acetone. |

Neoprene KNR has the following properties:

| | |
|---|---|
| Specific gravity | 1.23. |
| Appearance | Amber-colored. |
| Odor | None. |
| Plasticity | Easily plasticized to a putty-like consistency. |
| Solubility | Has limited solubility before plasticizing after which it is readily soluble in aromatic and chlorinated hydrocarbons and naphthenic petroleum solvents. It is insoluble in aliphatic hydrocarbons, water, alcohol and partially soluble in esters and ketones. |

Neoprene AC is generally harder than Neoprene KNR.

As the carbon black component, we prefer to employ the material known as "Thermax" and marketed by the R. T. Vanderbilt Co., but we can also employ other carbon blacks such as "Carbon Black SRF" marketed by the Witco Chemical Co. "Thermax" has the following properties:

| | |
|---|---|
| Composition | Medium thermal carbon. |
| Specific gravity | 180. |
| Color | Dark gray. |
| pH | 7.2–7.4. |
| Particle size | 470–500 mμ. |
| Properties | Mixes easily with low heat generation. |

"Carbon Black SRF" has the following properties:

| | |
|---|---|
| Composition | Semi-reinforcing furnace black. |
| pH | 9.2–9.6. |
| Color | Blue gray. |
| Average partial size | 160–200mμ. |

The carbon black serves as a filler to improve the tensile strength properties of the mask produced by our maskant composition.

The phenolic resin preferably is of the phenol-aldehyde type, e.g. phenol-formaldehyde resin, and we prefer to use the product designated "Resin CKR-1634," marketed by Bakelite Chemical Co. The latter material has a specific gravity of 1.11, a melting point of 190–215° F., has 100% non-volatiles and an acid number of 52–82.

Representative of the chlorinated natural rubber which we may employ is "Parlan" stabilized, marketed by Hercules Powder Co. The properties of this material are as follows:

| | |
|---|---|
| Color of film | Water-white. |
| Odor | None. |
| Specific gravity | 1.64. |
| Index of refraction | 1.554. |
| Tensile strength, pounds per sq. inch, dry | 4,270. |
| Tensile strength, pounds per sq. inch, wet | 4,100. |
| Modulus of elasticity, pounds per sq. inch | $1.4 \times 10^5$. |
| Burning rate | Noninflammable. |
| Softening point (unstabilized) | Decomposes at 135° C. to 150° C. |
| Moisture absorption at 80% relative humidity in 24 hours, percent | 0.27. |
| Resistance to | |
| Acids, weak | Excellent. |
| Acids, strong | Excellent. |
| Alkalies, weak | Excellent. |
| Alkalies, strong | Excellent. |

As antioxidant we prefer to use phenyl-alpha naphthyl amine which has no effect on the rate of cure of the rubber regardless of the accelerator used. As rubber accelerator we prefer to employ a butyraldehyde-monobutylamine condensation product such as "Accelerator 833" marketed by Du Pont, which is in the form of a non-toxic translucent amber colored liquid, having a specific gravity of 0.86. As an activator for this accelerator we preferably employ litharge (lead monoxide). As an additional component of the accelerator composition for accelerating curing particularly of the phenolic resin, we prefer to employ magnesium oxide. When the latter compound is employed, we have found from experience that a quantity not much more than about 0.4% by weight of the composition should be employed, since undesirable flocculation of the maskant composition in the solvent may occur using percentages greater than about 0.4%. However, equivalent materials for those mentioned above may be employed. The solvent utilized in our maskant composition can be an aromatic solvent such as toluene and petroleum aromatics, methyl ethyl ketone, and the like, or mixtures thereof, toluene being preferred.

The components of our maskant composition may be mixed or blended in any desired manner. For example, a preferred mode of preparing the composition including the accelerator, is to first break down the nerve tissue of the chloroprene polymer or neoprene by milling a mixture of the neoprene, carbon black and magnesium oxide on suitable milling equipment, such as a Banbury mill. These well mixed materials are then dissolved in toluene. The remaining ingredients are added, preferably, but not necessarily, in a toluene solution, to the toluene solution of carbon black, magnesium oxide, and neoprene. The final composition is in the form of a colloidal solution which is homogeneous and does not settle out.

The composition can be made in varying viscosity ranges depending particularly on the amount of solvent incorporated in the formulation and the relative proportions of chloroprene polymer or neoprene present, and the formulation can be stored or applied immediately to the surface of the articles to be coated.

The above maskant composition can be applied to the substrate or metal surface in any suitable manner such as by spraying, brushing, flow coating, dipping, silk screening or any other conventional method for applying paints, lacquers or coatings. Although our novel maskant formulation is particularly suited for use on aluminum and its alloys as substrates, it is to be understood that such formulation can also be employed on other materials such as ferrous and other non-ferrous alloys to protect certain areas thereof from corrosion by etching solutions. Hence, the formulation is alkali resistant and is also resistant to non-oxidizing acids and to oxidizing acids when sufficiently dilute and at moderately elevated temperatures. In acid etchants such as HCl, the maskant is highly resistant to attack. As to its chemical resistance to $H_2SO_4$ or $HNO_3$ separately, the maskant is resistant at concentrations up to about 6 normal and up to about 150° F., while in $H_2SO_4$—$HNO_3$ or $HNO_3$—HCl mixtures, the maskant is resistant up to concentrations of about 3 normal and temperatures up to about 100° F. The maskants hereof are likewise resistant to alkaline solutions, e.g. comprising caustic alkali or soda ash at concentrations up to about 10 normal and temperatures up to the boiling temperature of the solution.

After application of the maskant composition to the substrate, the plastic coating is cured by heating, e.g. at about 200–225° F., for from about one half to two hours, depending on the thickness of the coating or mask film. The mask is then cooled to room temperature either by allowing it to cool gradually or by immersion in cold water. The part is then treated with an etching solution to cause the uncovered or exposed surfaces of the part to be etched or corroded by the etching solution to the desired depth and to form the desired etch pattern or configuration. Generally the masking composition is initially applied to the entire surface of the part, and the mask cut and hand stripped in accordance with a preselected design, to uncover or expose a surface portion of the part corresponding to said design. This can be accomplished with or without a template.

Various types of etching solutions, acidic or alkaline, can be employed for etching the exposed surface of the part adjacent the mask, depending on the nature of the metal to be etched. For example, in the case of aluminum and its alloys, which are alkali soluble, a hot aqueous etching solution is generally employed containing an alkali such as sodium or potassium hydroxide, trisodium phosphate, soda ash or the like, or mixtures thereof, preferably sodium hydroxide solution. Temperature is generally maintained in a range say from 100° F. to about boiling, although lower temperatures can be used. Generally the alkali concentration employed in such solutions ranges from 0.1 to 10 normal.

Particularly when aluminum or its alloys are to be coated with our maskant for etching, the metal surface is preferably cleaned. Ordinarily these metals contain a thin surface coating or film of oil with dirt particles in the oil film. Treatment of such surface with a mild alkaline cleaner such as mixtures of silicates, phosphates, soda ash and wetting agents, marketed as a composition known as "Turco 4090" by Turco Products, Inc., of Los Angeles, California, removes this oil-dirt film. If the metal surface has grease thereon, this can be removed by treatment in a solvent such as tetrachlorethylene prior to treatment with the alkaline cleaner.

When step etching or metal removal is to be performed a portion of the mask is stripped from the area to be most deeply etched, or the mask is applied in such a manner that the surface portion to be most deeply etched remains uncovered. Following the first etching treatment a portion of the mask is peeled or hand stripped and this newly uncovered portion, along with the previously etched portion is etched, the newly uncovered portion being etched to the second greatest depth. This is continued, the last etching treatment forming the etch of least depth. The difference in etch depth between successive step cuts corresponds to the depth of each step. After the mask has been removed from the area to be etched in a succeeding stage, this area may be cleaned by wiping with a suitable solvent such as toluene, prior to subsequent etching.

The following examples are illustrative of practice of the invention.

*Example 1*

Figure 2:
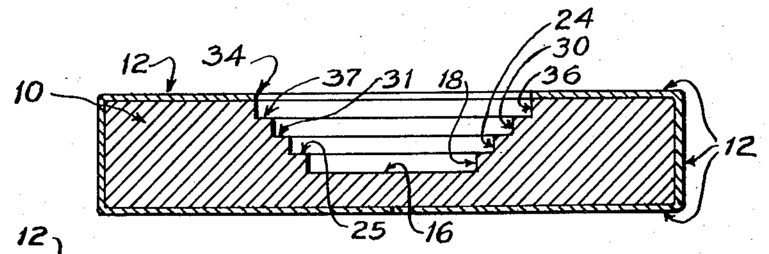
Figure 3:
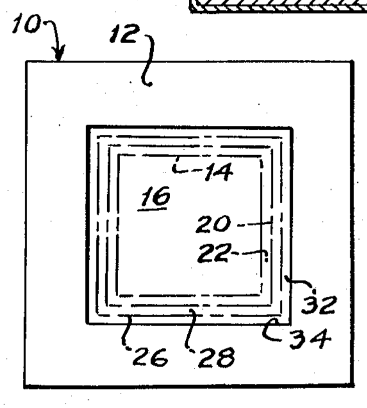

Reference is made to Figs. 1 to 3 of the accompanying drawing illustrating the procedure set forth in the instant example. Fig. 1 is a plan view of a part which is masked and etched to form a stepped etch pattern. Fig. 2 is a section taken on line 2—2 of Fig. 1, and Fig. 3 illustrates stripping of the mask at the successive etching stages to obtain the desired etch pattern.

A formulation is prepared consisting of the following ingredients in the proportions listed in column A. The second column sets forth a range of proportions of the ingredients which can be employed. The amounts are set forth in terms of percentage by weight.

| | A in percent | Range in percent |
|---|---|---|
| Neoprene AC | 9.6 | 5–15 |
| Neoprene KNR | 6.6 | 3–9 |
| Chlorinated natural rubber ("Parlon") | 4.5 | 2–6 |
| Phenolic Resin (CKR 1634) | 7.1 | 1–9 |
| Carbon Black (Thermax) | 9.1 | 5–15 |
| Phenyl-alpha naphthyl amine | 0.4 | 0.2–0.6 |
| Toluene | 62.7 | remainder |
| | 100.0 | |

An accelerator composition is prepared consisting of the following ingredients in the proportions listed in column B, the second column setting forth a range of proportions of said ingredients, the quantities being expressed in percentage by weight.

| | B in percent | Range in percent |
|---|---|---|
| Magnesium oxide | 11.0 | 5–15 |
| Litharge | 14.0 | 10–20 |
| Aldehyde-amine Condensate ("Accelerator 833") | 8.0 | 6–10 |
| Toluene | 67.0 | remainder |
| | 100.0 | |

Composition B is mixed with composition A in a proportion of 4 parts of B to 100 parts of A to form a maskant composition.

A 2024 aluminum alloy part is treated in a non-corrosive alkaline cleaner in the form of a solution of "Turco 4090" and the part rinsed in water. Referring to Figs. 1 and 2 of the accompanying drawing, illustrating the invention process, the maskant composition C, consisting of the above mixtures of compositions A and B, is sprayed onto the surface of the aluminum alloy part 10 to form a coating 12 about 0.005" thick covering the entire surface of the part. The mask is then cured by heating between 200 and 225° F. for one-half to one hour. A square of the mask indicated at 14 is then cut away, leaving an unexpected portion 16 of the surface area to be etched.

The part is then immersed in an 11% caustic alkali solution at a temperature of 190° F. After etching of the part to the desired depth indicated at 18 in the unexposed area, the part is removed from the solution. It is observed that the mask is still tightly bonded to the part surface and particularly that the edges of the mask are still clean and sharp with no noticeable deterioration thereof, and that such edges are tightly bonded to the substrate.

The mask 12 is then cut along the line 20 to form a new design, and the inner peripheral portion 22 of said mask corresponding to said design is removed from the substrate by inserting a sharp edged instrument beneath the edge 14 of the mask, and then peeling the cut portion 22 of the mask from the substrate, said cut portion being readily strippable by hand.

Etching of the part is then continued to produce a desired depth of etch 24 in the surface portion 25 of the part previously covered by the cut portion 22 of the mask. The part is then removed from the solution, and the mask 12 is cut along a line 26 to form a new design, the inner peripheral portion 28 of the mask corresponding to said new design being removed from the surface of the part by inserting a knife under the edge 20 and then stripping the cut portion 28 from the surface of the part by hand.

The part is then again immersed in the caustic etching solution and treated therein for a period sufficient to produce a depth of etch 30 in the exposed peripheral surface area 31 of the part.

After this period of etching, the part is removed, another inner peripheral portion 32 of the mask cut along line 34, said portion 32 removed by hand stripping in the manner noted above, and the part again immersed in the etching solution and treated therein for a time sufficient to produce a depth of etch 36 in the peripheral surface portion 37 of the part. The part is removed from the etching solution and the mask removed by peeling in the above manner, leaving a stepped etch having four etch levels or depths 18, 24, 30 and 36, and in which the surface portion 16 of the part initially uncovered and exposed to etching in all of the etching stages is of greatest depth, and the portions 22, 28 and 32 successively exposed to etching have successively shallower depths.

*Example 2*

The procedure of Example 1 is repeated through the first etching operation. The entire mask is then peeled from the substrate by first inserting a sharp edged instrument beneath an edge of the mask, and the mask is readily stripped from the part surface, forming an etch pattern having a single or uniform etch depth indicated at 18.

*Example 3*

A mask formulation is prepared consisting of the following ingredients in the proportions listed in column D in percent by weight, the second column setting forth a range of proportions of ingredients which can be utilized.

| | D in percent | Range in percent |
|---|---|---|
| Neoprene KNR | 8.17 | 5–15 |
| Neoprene AC | 0.89 | 0–2 |
| Carbon Black SRF | 9.08 | 5–10 |
| Phenyl-alpha naphthyl amine | 0.16 | 0.08–0.3 |
| Phenolic resin (CKR 1634) | 2.57 | 1–5 |
| Chlorinated natural rubber ("Parlon") | 1.68 | 1–5 |
| Magnesium oxide | 0.19 | 0.1–0.4 |
| Aldehyde amine condensate ("Accelerator 833") | 0.13 | 0–0.2 |
| Litharge | 0.24 | 0.1–0.4 |
| Aromatic solvent (Toluene) | 76.89 | remainder |
| | 100.00 | |

A 2024 aluminum alloy plate is treated first in an alkaline cleaner and rinsed in a manner similar to that described in Example 1, and the part then dipped in the above maskant composition to attain the desired film thickness of maskant on the surface of the alloy plate. The maskant composition is then cured by heating the mask at 200 to 225° F. for one-half to two hours. A design is cut in the mask and a portion of the mask corresponding to this design is peeled from the part surface.

The part is then immersed in a hot caustic alkali etching solution similar to that described in Example 1 for a period sufficient to produce the desired depth of etch in the exposed surface portions of the part not covered by the mask. As in the case of Example 1, following removal of the etched part from the solution, it is noted that the mask remains tightly adherent to the substrate even at the mask edges, which remain sharp and clearly defined. A second design is then cut in the mask, and this cut portion is then removed by peeling or stripping it from the part surface in a manner similar to that described in Example 1, this mask portion being readily stripped from the part. The part is again treated in the etching solution following which another design is cut in the mask, the cut portion removed by peeling as above, and the part again etched. After etching, the mask is removed by peeling, leaving a sharply defined three step etch design in which the first exposed portion is etched deepest, the area exposed thereafter being etched to a lesser depth and the area exposed last to etching is etched the least.

*Example 4*

The procedure of Example 3 is repeated through the first etching operation. The entire mask is then peeled from the substrate by first inserting a knife beneath an edge of the mask, after which the mask is readily stripped from the part surface, to form a single depth etch.

*Example 5*

A maskant composition is prepared consisting of the following ingredients in the proportions listed in column E in percent by weight, the second column setting forth a range of proportions of ingredients which can be utilized.

| | E in percent | Range in percent |
|---|---|---|
| Neoprene KNR | 16.90 | 14–20 |
| Carbon Black (Thermax) | 13.53 | 10–20 |
| Antioxidant (phenyl-alpha naphthyl amine) | 0.24 | 0.12–0.35 |
| Phenolic resin | 3.84 | 1–5 |
| Magnesium oxide | 0.4 | 0.10–0.40 } |
| Aldehyde amine condensate ("Accelerator 833") | 0.20 | 0.10–0.30 } 0.40–1.3 |
| Litharge | 0.44 | 0.20–0.60 } |
| Aromatic solvent | 64.45 | remainder |
| | 100.00 | |

A 7075 aluminum alloy plate is treated first in an alkaline cleaner and rinsed in a manner similar to that described in Example 1, and the plate is dipped into the maskant composition E to cover certain surface portions of the alloy plate. The maskant composition is then cured by heating the mask at 200 to 225° F. for one-half to two hours.

A design is cut in the mask and a portion of the mask corresponding to this design is peeled from the part surface.

The part is then treated in the manner described in Example 3, to obtain a three step etch pattern as in the case of Example 3.

*Example 6*

The maskant composition E of Example 5 is sprayed onto the surface of a 1020 steel alloy. The mask is cured in a manner similar to that described in Example 5. A design is cut into the mask and the portion of the mask corresponding to said design is stripped, leaving certain portions of the part uncovered. The resulting article is placed in an etching bath comprising a solution of nitric, hydrochloric and phosphoric acids at 140° F.

Following removal of the etched part from the solution, it is noted that the mask remains tightly adherent to the substrate, even at the mask edges, which remain sharp and clearly defined. The mask is then removed by peeling or stripping it from the part surface, in a manner similar to that in Example 2, the mask being readily stripped from the part, leaving a sharply defined etch pattern in the part surface.

*Example 7*

An FS–1 magnesuim alloy is cleaned in a cleaner composed of a mixture of salts of phosphates, silicates, caustic soda and wetting agents. Maskant composition E of Example 5 is applied to the cleaned magnesium alloy in the same manner as in Example 6, a design cut in the mask and the cut portion is stripped from the surface of the part. The part is then etched in a dilute solution (5%) sulfuric acid at 70–100° F., and following etching, the mask is readily stripped from the part surface.

*Example 8*

The procedure of Example 6 is repeated through the etching operation. The part is then treated in the manner described in Example 3, following the first etching treatment, to obtain a three step etch pattern as in Example 3.

The masks formed in the above examples can be tested for peel adhesion by the following procedure:

A part is coated with the maskant composition to obtain a 5 mil etch film (.005") of dried coating. A strip of the coating one inch in width is partially stripped from the surface of the part, and the free end is placed in a clamp which is attached to a spring having an indicator calibrated in pounds of tension on the spring.

The free end of the strip of mask to which said clamp and spring are attached is then bent back about 180°, with the bent back portion maintained above and parallel to the surface of the part. The strip is further peeled from the surface of the part by pulling on the spring, and the rate of peel is controlled to peel 5 inches of the strip per minute from the part surface. During this period of peeling of the strip and movement of the spring, the tension required to produce such peeling under these conditions is read from the indicator. The values thus obtained are in terms of pounds for a rate of 5 inches per minute of peeling of an inch strip of coating.

Under the above test procedure, a good maskant coat should have a peel adhesion test value of between 2.4 and 2.8 lbs. when the test is carried out at 25° C., in order that the coating be sufficiently adherent to the substrate yet easily strippable therefrom. The peel adhesion test value of the coatings formed in the examples are between 2.5 and 2.7 lbs., and hence have good peel adhesion.

Another test procedure is to heat the part having the mask thereon, which mask is applied in the manner described above, in hot water at 190° F. for 30 minutes, and then carry out the test procedure as set out above.

Under these test conditions, a proper peel adhesion value should be between 1.5 and 1.9 lbs. The masks formed in the examples have a value between 1.6 and 1.8 lbs. and hence have good peel adhesion characteristics under these test conditions.

The compositions of the alloys employed in the examples are set out below:

2024 aluminum: 91.5% Al, .5% Si, .5% Fe, 4.9% Cu, .2% Mn, .1% Cr, 1.7% Ni, .2% Zn, .5% Mg.

7075 aluminum: 90% Al, .5% Si, .7% Fe, 1.2% Cu, .3% Mn, .2% Cr, 5.2% Zn, 2% Mg.

1020 steel: .22% carbon, .12% Mn, .01% P, .03% S, .01% Si.

FS–1 magnesium: 95.5% Mg, 3% Al, .5% Mn, 1% Zn.

From the foregoing, it is seen that we have provided a novel procedure for single step or multiple step etching to produce a sharp etch pattern. This is accomplished by means of a coating composition having sufficient adhesion to the substrate to resist chemical attack of the etchant, yet remains plastic after one or more etching treatments so that the coating can be easily cut and hand peeled at any stage of the etching process. By cutting and stripping the mask in accordance with a chosen design, following each etching stage of a plurality of etching treatments, employing such maskant compositions, a stepped etch pattern having a plurality of etch levels can be obtained. Hence it is seen that in this respect particularly, our procedure constitutes a marked improvement over the previously noted laborious and expensive prior art etching procedures of masking and remasking, for production of a stepped etch pattern.

It is to be noted that the individual steps or cuts formed in the etch pattern of the part by step etching according to the procedure herein, can be of the same depth, or the various steps can have unequal depths, depending on the time of immersion, concentration and temperature of the etch bath during each of the etching treatments.

While we have described particular embodiments of our invention for the purpose of illustration, it should be understood that various modifications and adaptations thereof may be made within the spirit of the invention as set forth in the appended claims.

We claim:

1. A process of etching the surface of a metal object to obtain an etch pattern having a plurality of etch levels, which comprises applying to an area of said surface a coating composition, said composition forming a mask which is resistant to attack by chemical etching solutions and having substantial adherence to said surface during the etching treatment, said mask being cuttable and strippable prior to and subsequent to treatment with etching solution, providing an exposed bare surface portion of said object adjacent said mask by cutting a first design in said mask, stripping from the object the area of the mask described by the design cut, subjecting said object to the action of an etching solution, cutting a second design in said mask, stripping from said object the area of the mask described by the second design cut, and again subjecting said object to the action of an etching solution.

2. A process of etching the surface of a metal object to obtain an etch pattern having a predetermined plurality of etch levels, which comprises applying to an area of said surface a coating composition, said composition forming a mask which is resistant to attack by chemical etching solutions and having substantial adherence to said surface during the etching treatment, said mask being cuttable and strippable prior to and subsequent to treatment with etching solution, cutting a first design in said mask, stripping from said object the area of the mask described by the design cut; treating the surface of said part in an etching solution to etch the exposed uncovered surface portion of said object, cutting a second design in said mask adjacent said first design, stripping from said object the area of the mask described by the second design cut, treating the surface again in an etching solution, thereby producing an etch pattern having a plurality of adjacent etching depths.

3. A process of etching the surface of a metal object to obtain an etch pattern having a predetermined plurality of etch levels, which comprises applying to an area of said surface a coating composition, said composition forming a mask which is resistant to attack by chemical etching solutions and having substantial adherence to said surface during the etching treatment, said mask being cuttable and strippable prior to and subsequent to treatment with etching solution, cutting a first design in said mask, stripping from said object the area of the mask described by the design cut, treating the surface of said part in an etching solution to etch the exposed uncovered surface portion of said object, cutting a second design in said mask, stripping from said object the area of the mask described by the second design cut, treating the surface again in an etching solution, repeating the cutting, stripping and etching procedure until the desired stepped etch pattern having the predetermined plurality of etch levels is obtained, and stripping the residual mask from said surface.

References Cited in the file of this patent

UNITED STATES PATENTS

| | | |
|---|---|---|
| 1,614,935 | Sardou | Jan. 18, 1927 |
| 1,832,716 | Lopez | Nov. 17, 1931 |
| 2,332,003 | New | Oct. 19, 1943 |
| 2,485,097 | Howland | Oct. 18, 1944 |
| 2,587,945 | Wirth | Mar. 4, 1952 |
| 2,671,978 | Brusetti | Mar. 16, 1954 |

FOREIGN PATENTS

| | | |
|---|---|---|
| 109,691 | Australia | Feb. 8, 1940 |

OTHER REFERENCES

"American Machinist," Sept. 13, 1954, pages 200–202.